United States Patent
Chang et al.

(10) Patent No.: US 8,667,345 B2
(45) Date of Patent: Mar. 4, 2014

(54) BURN-IN METHOD FOR EMBEDDED MULTI MEDIA CARD, AND TEST BOARD USING THE SAME, AND EMBEDDED MULTI MEDIA CARD TESTED BY THE SAME

(75) Inventors: Chia-Fang Chang, Hsinchu (TW); Hsu-Ping Ou, Hsinchu (TW)

(73) Assignee: Silicon Motion, Inc., Jhubei (TW)

( * ) Notice: Subject to any disclaimer, the term of this patent is extended or adjusted under 35 U.S.C. 154(b) by 211 days.

(21) Appl. No.: 13/446,483

(22) Filed: Apr. 13, 2012

(65) Prior Publication Data

US 2013/0103992 A1    Apr. 25, 2013

Related U.S. Application Data

(60) Provisional application No. 61/551,168, filed on Oct. 25, 2011.

(51) Int. Cl.
*G11C 29/00* (2006.01)
*G01R 27/28* (2006.01)
*G01R 31/00* (2006.01)
*G01R 31/14* (2006.01)

(52) U.S. Cl.
USPC ...... 714/718; 702/117; 702/120; 324/762.01; 324/762.02; 365/201

(58) Field of Classification Search
None
See application file for complete search history.

(56) References Cited

U.S. PATENT DOCUMENTS

| | | | |
|---|---|---|---|
| 5,901,096 A * | 5/1999 | Inokuchi et al. | 365/201 |
| 8,069,380 B2 * | 11/2011 | Murin et al. | 714/718 |
| 8,363,482 B2 * | 1/2013 | Kim et al. | 365/185.25 |
| 2002/0116668 A1 * | 8/2002 | Chhor et al. | 714/42 |
| 2008/0144375 A1 * | 6/2008 | Cheng | 365/185.05 |
| 2011/0216602 A1 * | 9/2011 | Kim et al. | 365/185.22 |
| 2012/0146673 A1 * | 6/2012 | Kim et al. | 324/750.3 |

* cited by examiner

*Primary Examiner* — Guerrier Merant
(74) *Attorney, Agent, or Firm* — Wang Law Firm, Inc.; Li K. Wang; Stephen Hsu

(57) ABSTRACT

A burn-in method for an embedded Multi Media Card (eMMC), and a test board using the same, and an eMMC tested by the same. The disclosed burn-in method comprises the steps as below: writing a test pattern to a flash memory of the eMMC; electrically connecting a command line of the eMMC to ground to operate the eMMC in a boot state; performing a burn-in procedure on the flash memory when the eMMC is in the boot state and the test pattern is recognized as being contained in the flash memory; and collecting a test report during the burn-in procedure, wherein the test report is stored in the flash memory.

16 Claims, 6 Drawing Sheets

BURN-IN METHOD FOR EMBEDDED MULTI MEDIA CARD, AND TEST BOARD USING THE SAME, AND EMBEDDED MULTI MEDIA CARD TESTED BY THE SAME

CROSS REFERENCE TO RELATED APPLICATIONS

This application claims the benefit of U.S. Provisional Application No. 61/551,168 filed on Oct. 25, 2011, the entirety of which is incorporated by reference herein.

BACKGROUND OF THE INVENTION

1. Field of the Invention

The present invention relates to an embedded Multi Media Card (eMMC), and in particular relates to burn-in test for an eMMC.

2. Description of the Related Art

The MultiMediaCard (MMC) is based on a NAND-based flash memory. Typically, an MMC is used as a storage media for a portable device, in a form that can easily be removed for access by a PC. For example, a digital camera would use an MMC for storing image files. With a card reader (such as an MMC reader), a user can copy pictures to his or her computer.

Based on the MMC standard, an embedded storage solution with an MMC interface, flash memory and controller all in a package is named an embedded Multi Media Card (eMMC). To guarantee the reliability of the flash memory within the eMMC, a burn-in test is required, which is the process by which the flash memory is exercised prior to being placed in service.

FIG. 1 shows a conventional burn-in test design for eMMC. As shown, N eMMCs 102_1-102_N are inserted into N card readers 104_1-104_N, respectively, to be connected to a host 106. The host 106 outputs commands to the command lines of the eMMC 102_1-102_N to operate the eMMCs 102_1-102_N all in a transfer state. The transfer state is designed for a conventional burn-in test.

However, it is difficult to further test heat endurance by the conventional test architecture of FIG. 1. For example, it is not feasible to put the host 106 in an oven or in a refrigerator.

A novel test architecture for an eMMC is called for.

BRIEF SUMMARY OF THE INVENTION

A burn-in method for an embedded Multi Media Card (eMMC), and a test board using the same, and an eMMC tested by the same are disclosed.

A burn-in method in accordance with an exemplary embodiment of the invention comprises steps shown below: writing a test pattern to a flash memory of an eMMC; electrically connecting a command line of the eMMC to ground to operate the eMMC in a boot state; performing a burn-in procedure on the flash memory when the eMMC is in the boot state and the test pattern is recognized as being contained in the flash memory; collecting a test report, wherein the test report is stored in the flash memory. In another exemplary embodiment, by the burn-in procedure, blocks of the flash memory are tested by the test pattern. Further, the collected test report may be referred to in normal operations of the eMMC.

A test board in accordance with an exemplary embodiment of the invention, comprising a mounting seat and a trace. The mounting seat is for carrying an eMMC on the test board. Note that in the eMMC mounted on the mounting seat, a flash memory has been written to contain a test firmware to be executed and a test pattern for a burn-in test. By the trace provided on the test board, a command line of the eMMC is electrically connected to ground to operate the eMMC in a boot state. Activated by the boot state of the eMMC and the test pattern contained in the flash memory, the executed test firmware performs a burn-in procedure on the flash memory to test a plurality of blocks of the flash memory by the test pattern and to collect a test report during the burn-in procedure. The test report is stored in the flash memory. Further, the test report may be referred to in normal operations of the eMMC.

An eMMC in accordance with an exemplary embodiment of the invention comprises a flash memory and a controller, wherein the controller includes a read only memory. The flash memory is stored with a customized code and a test report, wherein the test report was collected during a burn-in procedure, the burn-in procedure was performed on the flash memory when a command line of the eMMC was electrically connected to ground to operate the eMMC in a boot state as well as a test pattern was recognized as being contained in the flash memory, and a plurality of blocks of the flash memory were tested by the test pattern during the test procedure. The read only memory is stored with a read ROM code. The controller which may communicate with a host controls the flash memory in accordance with the ROM code and the customized code and by referring to the test report.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 1:
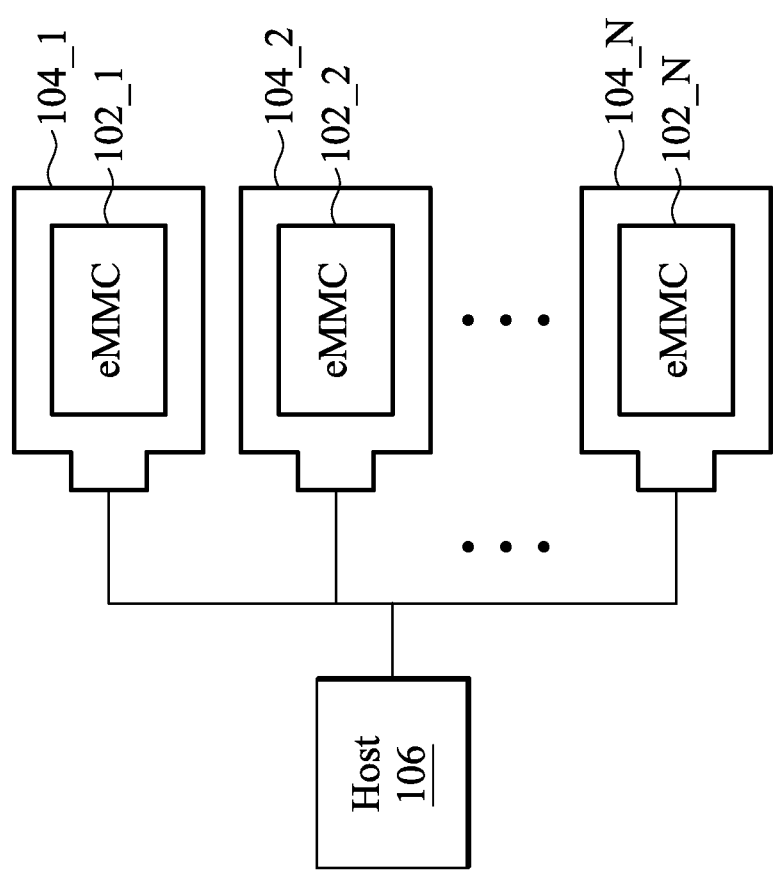
FIG. 1 shows a conventional burn-in test design for eMMC.
Figure 2:
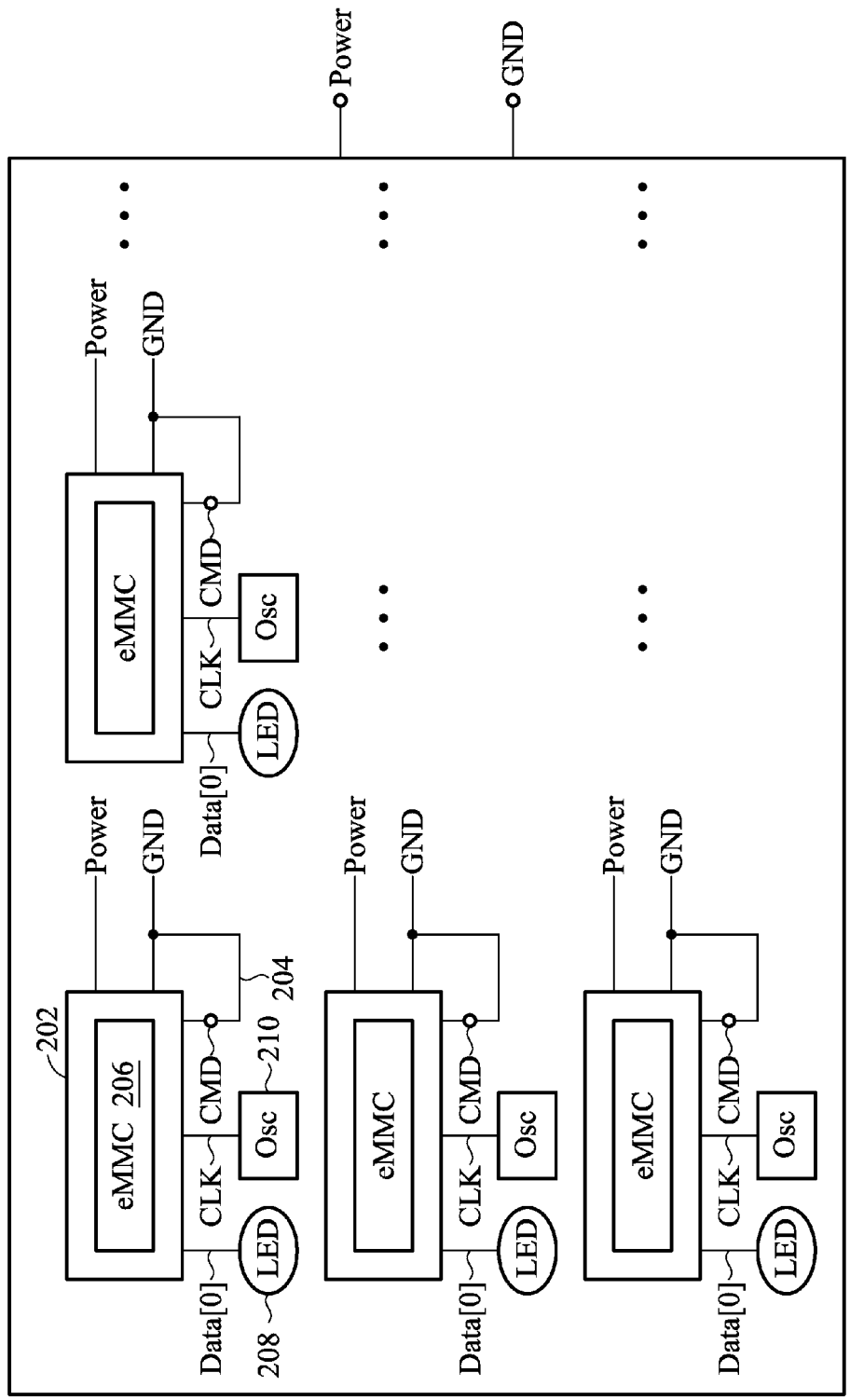
FIG. 2 shows a test board 200 for a burn-in test of an eMMC in accordance with an exemplary embodiment of the invention.

FIG. 2 shows a test board 200 for a burn-in test of an eMMC in accordance with an exemplary embodiment of the invention. The test board 200 is capable of testing a plurality of embedded Multi Media Cards. For simplicity, only one test kit (for a single eMMC) is discussed. A test kit may comprise a mounting seat 202 and a trace 204. By the mounting seat 202, an eMMC 206 connects to the test board 200.

Note that before being mounted on the mounting seat 202, the eMMC 206 may be first connected to a host to be downloaded with a test code and a test pattern. Thus, a flash memory of the eMMC 206 mounted on the mounting seat 202 already contains the test firmware to be executed and the test pattern for a burn-in test.

As for the trace 204, it electrically connects a command line CMD of the eMMC 206 to ground GND to operate the eMMC 206 in a boot state (conventionally used in providing boot data to a host). When the executed test firmware senses the boot state of the eMMC 206 and recognizes the test pattern contained in the flash memory, the executed test firmware further proceeds to perform a burn-in procedure on the flash memory to test a plurality of blocks of the flash memory by the test pattern. During the burn-in procedure, a test report is collected and stored in the flash memory and referred to in normal operations of the eMMC 206. Based on the test report collected by the aforementioned technique, an eMMC may more effectively utilize the flash memory therein, or, an eMMC may be graded before being sold. Further, because the burn-in procedure is dominated by the eMMC itself and no host or card reader is required, a heat endurance test is feasible on the test board 200.

The test board 200 may further comprise light emitting diodes (LEDs) for the different test kits on the test board 200. As shown, an LED 208 may be connected to a data line Data[0] of the eMMC 206. In an exemplary embodiment of the invention, the executed test firmware uses the data line Data[0] to present the status (e.g. product quality) of the flash memory of the eMMC 206 when performing the burn-in procedure. Thus, the LED 208 may glitter according to the status (e.g. product quality) of the flash memory of the eMMC 206. In a case wherein the LED 208 lights continuously, the eMMC 206 mounted on the mounting seat 202 may be regarded as a malfunctioned eMMC and be eliminated from the production line.

In another exemplary embodiment of the invention, the executed test firmware uses the data line Data[0] to show whether the burn-in procedure is being performed on the flash memory of the eMMC 206. Thus, the LED 208 may glitter according to the course of the burn-in procedure. The production line staff can clearly know about the course of the burn-in procedure.

The test board 200 may further comprise oscillators corresponding to the test kits on the test board 200. In the embodiment of FIG. 2, each oscillator is exclusive to one experimental kit. As shown, an oscillator 210 may be connected to a clock line CLK of the eMMC 206, to generate a clock signal exclusive to the eMMC 206 mounted on the mounting seat 202. The exclusive oscillator design ensures the accuracy of the clock signal. Note that the exclusive oscillator design is optional. In another exemplary embodiment, all test kits of the test board may share one single clock source.

Figure 3:
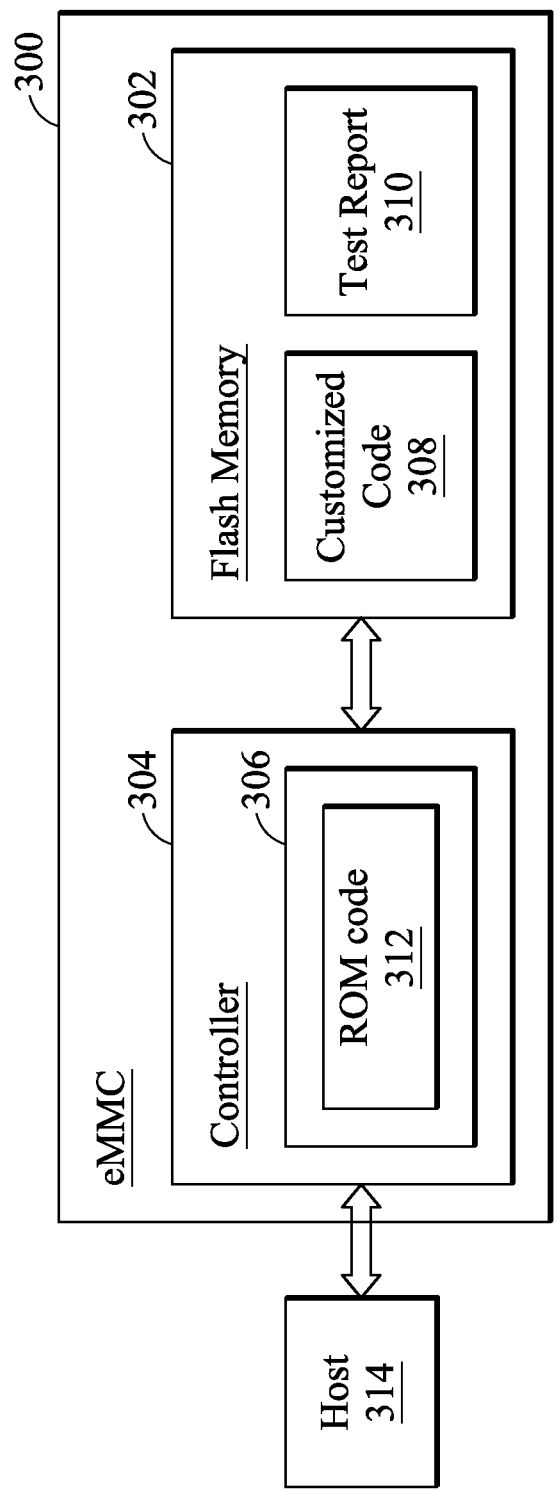
FIG. 3 shows an embedded Multi Media Card (eMMC) 300 in accordance with an exemplary embodiment of the invention.

FIG. 3 shows an embedded Multi Media Card (eMMC) 300 in accordance with an exemplary embodiment of the invention. The eMMC 300 comprises a flash memory 302 and a controller 304 having a read only memory 306. The flash memory 302 is stored with a customized code 308 and a test report 310. The read only memory 306 is stored with a ROM code 312.

The test report 310 was collected during a burn-in procedure that was performed in the production line. The burn-in procedure was performed when a command line of the eMMC 300 was electrically connected to ground to operate the eMMC 300 in a boot state and a test pattern was recognized as being contained in the flash memory, and, the blocks of the flash memory 302 were tested by the test pattern during the burn-in procedure. Referring to the test board 200 of FIG. 2, the test report collected by the test board 200 may be used as the test report 310 of the eMMC 300.

In practical application, the controller 304, communicating with a host 314, controls the flash memory 302 in accordance with the ROM code 312 and the customized code 308 and by referring to the test report 310.

The test report 310 may contain a time count (indicating how long the burn-in procedure was performed), or bad block information of the flash memory 302, or error checking and correction (ECC) status of each block. In an exemplary embodiment, the blocks of the flash memory are tested by the same test pattern, cycle by cycle, till a cycle number is satisfied. Thus, the test report 310 may further contain a cycle count (indicating the cycle number of the burn-in procedure) or a number of failed blocks of each cycle.

Figure 4:
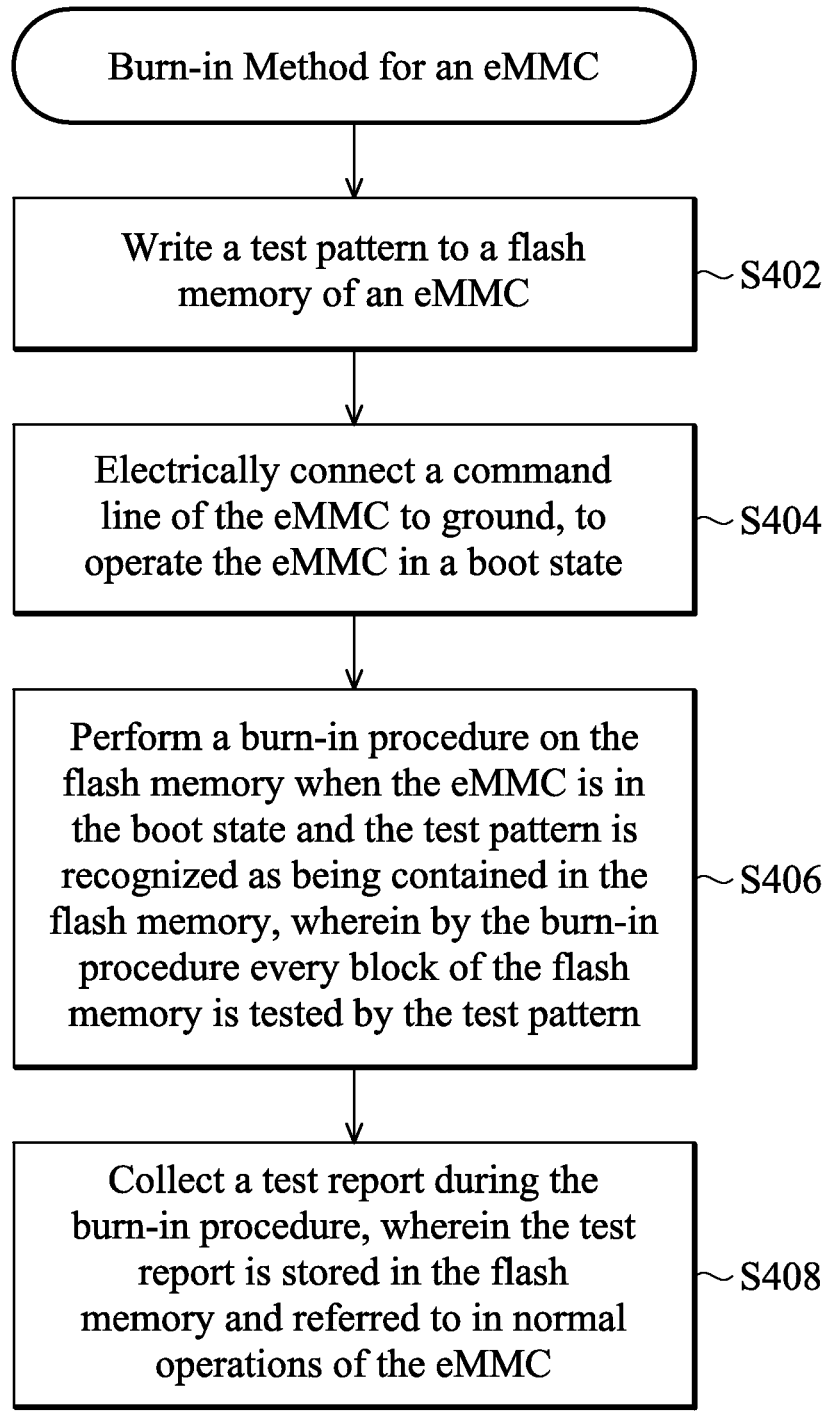
FIG. 4 shows a flowchart depicting a burn-in method for eMMC in accordance with an exemplary embodiment of the invention.

FIG. 4 shows a flowchart depicting a burn-in method for eMMC in accordance with an exemplary embodiment of the invention. In step S402, a test pattern is written to a flash memory of an eMMC. In step S404, a command line of the eMMC is electrically connected to ground to operate the eMMC in a boot state. In step S406, a burn-in procedure is performed on the flash memory when the eMMC is in the boot state and the test pattern is recognized as being contained in the flash memory, wherein by the burn-in procedure every block of the flash memory is tested by the test pattern. In step S408, a test report is collected during the burn-in procedure, wherein the test report is stored in the flash memory and referred to in normal operations of the eMMC.

In an exemplary embodiment of the burn-in method, an environmental temperature is changed dramatically during the burn-in procedure, to test the eMMC by the test pattern with various temperatures. Therefore, heat endurance of the eMMC is examined during the burn-in procedure.

In an exemplary embodiment of the burn-in method, a data line of the eMMC is utilized to present the status (e.g. product quality) of the flash memory during the burn-in procedure. In another embodiment of the burn-in method, the data line is utilized to show whether the burn-in procedure is being performed on the flash memory.

In an exemplary embodiment of the burn-in method, a progress report is further record during the burn-in procedure. The progress report is stored in the flash memory and is referred to when a burn-in procedure is resumed after the occurrence of a previous power failure.

In the burn-in procedure, each block of the flash memory may be erased and then programmed with the test pattern and then read for reliability examination. The test report may be collected by the erase/program/read actions. In an exemplary embodiment, the blocks of the flash memory are tested by the test pattern, cycle by cycle, till a cycle number is satisfied. The test report may contain a cycle count, or a time count, or bad block information, or error checking and correction status of each block, or a number of failed blocks of each cycle.

In an exemplary embodiment of the burn-in method, the test report may be further used in grading the eMMC before the eMMC is sold.

Figure 5:
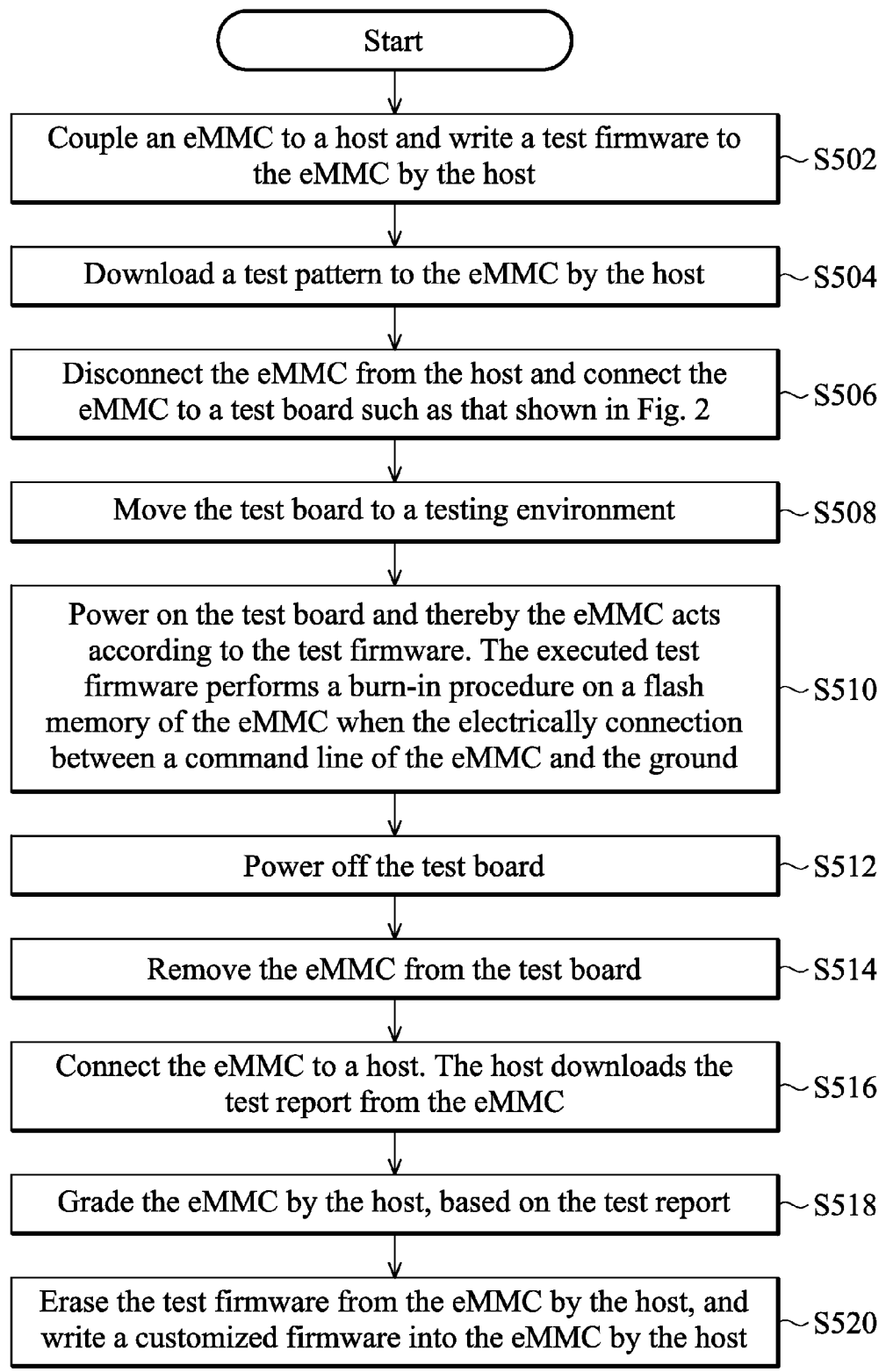
FIG. 5 shows a flowchart depicting burn-in test of an eMMC and eMMC grading (based on the burn-in test) in accordance with an exemplary embodiment.

FIG. 5 shows a flowchart depicting burn-in test of an eMMC and eMMC grading (based on the burn-in test) in accordance with an exemplary embodiment. In step S502, an eMMC (a.k.a. an eMMC sample) is coupled to a host (a.k.a. an eMMC host) and a test firmware is written to the eMMC (in the flash memory therein) by the host. In step S504, a test pattern is downloaded to the eMMC (in the flash memory therein) by the host. In step S506, the eMMC is disconnected from the host and is connected to a test board such as that shown in FIG. 2. In step S508, the test board is moved to a testing environment (e.g. a variable temperature system for heat endurance test.) In step S510, the test board is powered on and the eMMC acts according to the test firmware. With the electrically connection between a command line of the eMMC and the ground (established by the test board to operate the eMMC in a boot state) and the recognition of the test pattern, the executed test firmware performs a burn-in procedure on flash memory of the eMMC and collects a test report during the burn-in procedure. Then, the step S512 is performed. In step S512, the test board is powered off. In step S514, the eMMC is removed from the test board. In step S516, the eMMC is connected to a host and the host downloads the test report from the eMMC. In step S518, the host grades the eMMC according to the test report. In step S520, the test firmware is erased from the eMMC by the host, and the host writes a customized firmware into the eMMC (in the flash memory therein).

Figure 6:
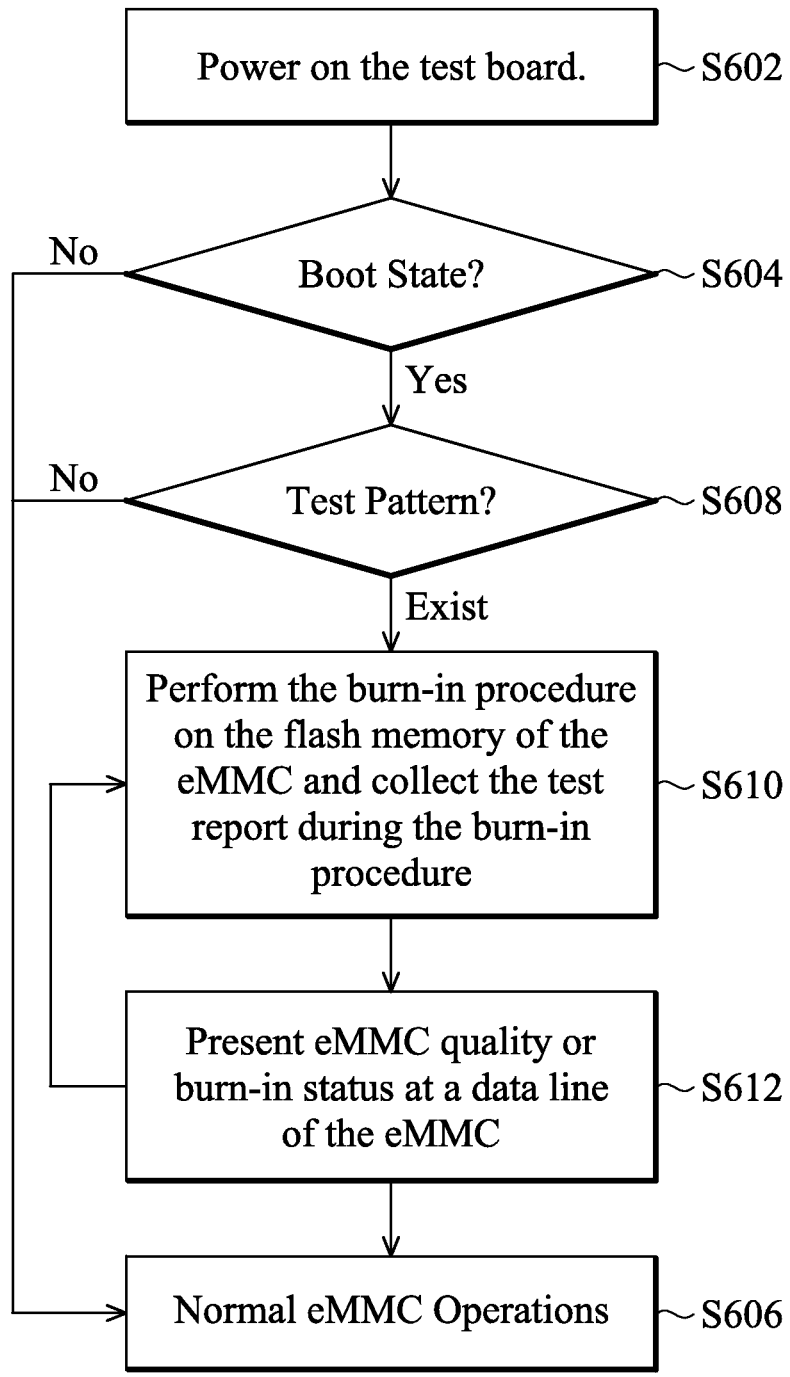
FIG. 6 is a flowchart in which an example of step S510 is detailed.

FIG. 6 is a flowchart in which an example of step S510 is detailed. In step S602, the test board is powered on. In step S604, it is determined whether the eMMC is in the boot state. When the eMMC is not in the boot state, the step S606 is performed for normal eMMC operations and the burn-in procedure is bypassed. When the eMMC is in the boot state, the S608 is performed, and it is determined whether the eMMC contains the test pattern. When no test pattern is recognized as being contained in the eMMC, the step S606 is performed for normal eMMC operations and the burn-in procedure is bypassed. When the test pattern is recognized in the eMMC, the step S610 is performed. In step S610, the burn-in procedure is performed on the flash memory of the eMMC and the test report is collected during the burn-in procedure. In some exemplary embodiments, an optional step S612 is performed with step S610. In step S612, eMMC quality or burn-in status is presented at a data line of the eMMC (may be shown by an LED).

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A burn-in method for a embedded Multi Media Card, comprising
   writing a test pattern to a flash memory of the embedded Multi-Media Card;
   electrically connecting a command line of the embedded Multi Media Card to ground to operate the embedded Multi Media Card in a boot state;
   performing a burn-in procedure on the flash memory when the embedded Multi Media Card is in the boot state and the test pattern is recognized as being contained in the flash memory; and
   collecting a test report during the burn-in procedure and storing the test report in the flash memory.

2. The burn-in method as claimed in claim 1, wherein the burn-in procedure tests a plurality of blocks of the flash memory by the test pattern.

3. The burn-in method as claimed in claim 2, further comprising controlling an environmental temperature to test the embedded Multi Media Card by the burn-in procedure with various temperatures.

4. The burn-in method as claimed in claim 2, further comprising using a data line of the embedded Multi Media Card to present a status of the flash memory when performing the burn-in procedure.

5. The burn-in method as claimed in claim 2, further comprising controlling the status of a data line of the embedded Multi Media Card to show whether the burn-in procedure is being performed on the flash memory.

6. The burn-in method as claimed in claim 2, further comprising recording a progress report during the burn-in procedure, wherein the progress report is stored in the flash memory and is referred to when a burn-in procedure is resumed after the occurrence of a previous power failure.

7. The burn-in method as claimed in claim 2, wherein, in the burn-in procedure, each block of the flash memory is erased and then programmed with the test pattern and then is read for reliability examination, collecting the test report.

8. The burn-in method as claimed in claim 2, wherein, in the burn-in procedure, the blocks of the flash memory are tested by the test pattern, cycle by cycle, till a cycle number is satisfied.

9. The burn-in method as claimed in claim 8, wherein the test report contains a cycle count, or a time count, or bad block information, or error checking and correction status of each block, or a number of failed blocks of each cycle.

10. The burn-in method as claimed in claim 2, wherein the test report is further used in grading the embedded Multi Media Card.

11. A test board for a burn-in test of an embedded Multi Media Card, comprising:
    a mounting seat for an embedded Multi Media Card having a flash memory containing a test firmware to be executed and a test pattern for the burn-in test;
    a trace, electrically connecting a command line of the embedded Multi Media Card to ground to operate the embedded Multi Media Card in a boot state, wherein the executed test firmware that has recognized the test pattern performs a burn-in procedure on the flash memory to test a plurality of blocks of the flash memory by the test pattern and to collect a test report during the burn-in procedure, wherein the test report is stored in the flash memory.

12. The test board as claimed in claim 11, further comprising:
    a light-emitting diode connected to a data line of the embedded Multi Media Card mounted on the mounting seat, wherein the data line presents a status of the flash memory when the burn-in procedure is performed.

13. The test board as claimed in claim 11, further comprising:
    a light-emitting diode connected to a data line of the embedded Multi Media Card mounted on the mounting seat, wherein the data line shows whether the burn-in procedure is being performed on the flash memory.

14. The test board as claimed in claim 11, further comprising:
    an oscillator, generating a clock signal exclusive to the embedded Multi Media Card mounted on the mounting seat.

15. An embedded Multi Media Card, comprising:
    a flash memory, stored with a customized code and a test report, wherein the test report was collected during a burn-in procedure, the burn-in procedure was performed when a command line of the embedded Multi Media Card was electrically connected to ground to operate the embedded Multi Media Card in a boot state and a test pattern was recognized as being contained in the flash memory, and the burn-in procedure tested a plurality of blocks of the flash memory by the test pattern; and a controller with a read only memory, wherein the read only memory is stored with a ROM code, and the controller controls the flash memory in accordance with the ROM code and the customized code and by referring to the test report.

16. The embedded Multi Media Card as claimed in claim 15, wherein the test report was collected by using the test pattern to test the blocks of the flash memory cycle by cycle till a cycle number is satisfied, and the test report contains a cycle count, or a time count, or bad block information, or error checking and correction status of each block, or a number of failed blocks of each cycle.

* * * * *